United States Patent
O'Grady

(10) Patent No.: US 7,365,299 B2
(45) Date of Patent: Apr. 29, 2008

(54) METHOD AND APPARATUS FOR PROVIDING FLEXIBLE PHOTODETECTOR BINNING

(75) Inventor: Matthew T. O'Grady, Phoenixville, PA (US)

(73) Assignee: Sensors Unlimited, Inc., Princeton, NJ (US)

( * ) Notice: Subject to any disclaimer, the term of this patent is extended or adjusted under 35 U.S.C. 154(b) by 17 days.

(21) Appl. No.: 11/125,304

(22) Filed: May 9, 2005

(65) Prior Publication Data

US 2006/0249657 A1 Nov. 9, 2006

(51) Int. Cl.
*H01L 27/00* (2006.01)
(52) U.S. Cl. ............... 250/208.1; 250/214 R
(58) Field of Classification Search ............ 250/208.1, 250/214 R, 214.1, 208.2; 348/294, 297, 348/302, 307, 308, 298, 315
See application file for complete search history.

(56) References Cited

U.S. PATENT DOCUMENTS

| | | | | |
|---|---|---|---|---|
| 5,471,515 | A * | 11/1995 | Fossum et al. | 377/60 |
| 6,144,366 | A | 11/2000 | Numazaki et al. | 345/156 |
| 7,091,466 | B2 * | 8/2006 | Bock | 250/208.1 |
| 2003/0164441 | A1 * | 9/2003 | Lyon et al. | 250/208.1 |
| 2006/0077269 | A1 * | 4/2006 | Kindt et al. | 348/294 |

OTHER PUBLICATIONS

U.S. Appl. No. 11/125,305, entitled "Method and Apparatus for Providing Enhanced Resolution in Photodetectors," filed May 9, 2005.
Office Action dated Nov. 22, 2006, from co-pending U.S. Appl. No. 11/125,305.
Office Action dated Mar. 30, 2007, from co-pending U.S. Appl. No. 11/125,305.
Notice of Allowance dated Sep. 19, 2007, from co-pending U.S. Appl. No. 11/125,305.

* cited by examiner

*Primary Examiner*—Georgia Epps
*Assistant Examiner*—Francis M. LeGasse, Jr.
(74) *Attorney, Agent, or Firm*—McCarter & English, LLP

(57) ABSTRACT

A method and apparatus for providing flexible photodetector binning are provided. A photodetector having multiple pixels, such as a charged coupled device (CCD), a focal plane array (FPA), an active pixel sensor (APS), or other suitable detector, is provided. A desired bin area is produced in the array by setting at least one of the pixels of the array to a low input impedance level and remaining pixels to a high input impedance level, so that charges generated at the high input impedance pixels diffuse through the detector array to adjacent, low input impedance pixels. The charge is collected at the low input impedance pixels, and corresponds to light detected in the bin area. The impedances of the pixels can be varied to provide bins of desired shapes and/or geometries. The bin areas can extend partially over one or more pixels.

23 Claims, 4 Drawing Sheets

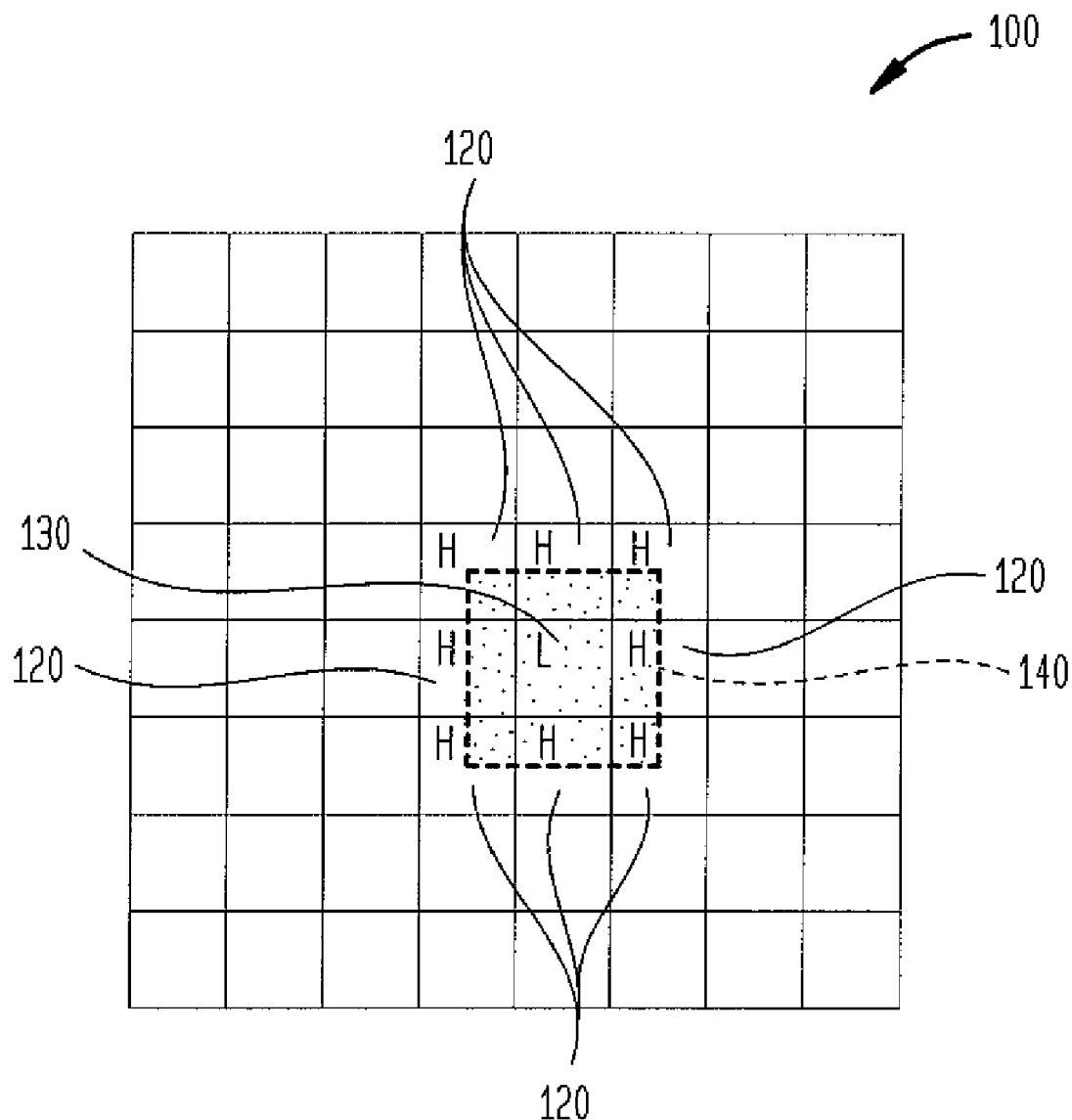

METHOD AND APPARATUS FOR PROVIDING FLEXIBLE PHOTODETECTOR BINNING

BACKGROUND OF THE INVENTION

1. Field of the Invention

The present invention relates to photodetector binning. More specifically, the present invention relates to a method and apparatus for providing flexible photodetector binning.

2. Related Art

In the field of optoelectronics, it is often desirable to increase the sensitivity of photodetectors. A common technique utilized in the art to achieve increased photosensitivity is pixel binning. Binning is desirable in applications such as wavefront sensing, digital zoom functions, and other applications where low light level imaging is required. The binning procedure increases the effective pixel size of the photodetector by combining the outputs of a plurality of pixels in a given region.

Binning techniques have been used extensively with charged coupled devices (CCDs) to increase the amount of signal produced by the device prior to on-chip amplification. However, visible active pixel sensors (APSs) and infrared focal plane arrays (FPAs) typically do not include binning capabilities due to voltage and current mode readout limitations of such detectors. Some APS and FPA circuits incorporate binning at the column level by using charge output from the pixels, and other circuits incorporate binning on the integration capacitor node. These methods are often undesirable because they occur after non-negligible noise sources are introduced by the readout circuit, thereby limiting improvements in the signal-to-noise ratio (SNR) of the device. Binning within the pixel provides the advantage of increasing a device's readout rate, but requires the addition of in-pixel switches to connect integration nodes together. This results in increased manufacturing complexity and costs, as well as limiting the ability to minimize pixel area and increasing the potential for crosstalk between pixels when the binning function is not activated.

Another limitation of existing binning techniques common to CCDs, APSs, and FPAs is that such techniques are limited to binning in fixed geometries determined by the implementation of CCD, APS, or FPA circuits. Previous binning techniques used in CCDs, APS, and FPAs achieve a sum of a number of pixels that form the subset of a larger pixel array, but cannot bin across partial pixel areas.

Accordingly, what would be desirable, but has not heretofore been provided, is a method and apparatus for providing flexible photodetector binning, wherein pixel binning can be performed across any desired number of pixels, or portions thereof, in any desired pattern or geometry.

SUMMARY OF THE INVENTION

The present invention provides a method and apparatus for providing flexible photodetector binning. A photodetector having multiple pixels is provided, such as a charged coupled device (CCD), a focal plane array (FPA), an active pixel sensor (APS), CMOS imager, or other suitable detector. A desired bin area is produced in the array by setting the input impedance of at least one of the pixels of the array to a high input impedance level and setting the input impedances of remaining pixels to low input impedance level, so that charges generated at the high input impedance pixels diffuse through the detector array to adjacent, low input impedance pixels. The charge is collected at the low input impedance pixels, and corresponds to light detected in the bin area. The impedances of the pixels can be varied to provide bins of desired shapes and/or geometries. The bin areas can extend partially over one or more pixels.

The present invention also provides a method for providing flexible detector binning. The method comprises the steps of providing a photodetector array; producing a bin area within the photodetector array by setting at least one pixel within the bin area to a low input impedance level and setting remaining pixels within the bin area to high input impedance level; receiving photons with the photodetector array, the photons generating charges within the pixels of the array; allowing charges generated at high input impedance pixels to migrate to at least one low input impedance pixel; and collecting charges at the at least one low input impedance pixel, the charges corresponding to photons received by the bin area. Optionally, the method could further comprise the steps of altering impedance levels of one or more pixels in the array to produce a new bin area; detecting photons in the new bin area; and collecting charges from at least one low input impedance pixel within the new bin area, the charges corresponding to photons detected in the new bin area.

BRIEF DESCRIPTION OF THE DRAWINGS

Other important objects and features of the invention will be apparent from the following Detailed Description of the Invention taken in connection with the accompanying drawings in which:

FIG. 3 is a diagram showing pixel binning achieved by the present invention in a two-dimensional photodetector array.

DETAILED DESCRIPTION OF THE INVENTION

The present invention relates to a method and apparatus for providing flexible photodetector binning in any suitable photodetector having multiple pixels, such as a charged coupled device (CCD), a focal plane array (FPA), an active pixel sensor (APS), CMOS imager, or any other suitable photodetector. A desired bin area is produced in the array by setting at least one of the pixels of the array to a low impedance level and remaining pixels to a high impedance level, so that charges generated at the high impedance pixels diffuse through the detector array to adjacent, low impedance pixels. The charge is collected at the low impedance pixels, and corresponds to light detected in the bin area. The impedances of the pixels can be varied to provide bins of desired shapes and/or geometries. The bin areas can extend partially over one or more pixels.

Figure 1:
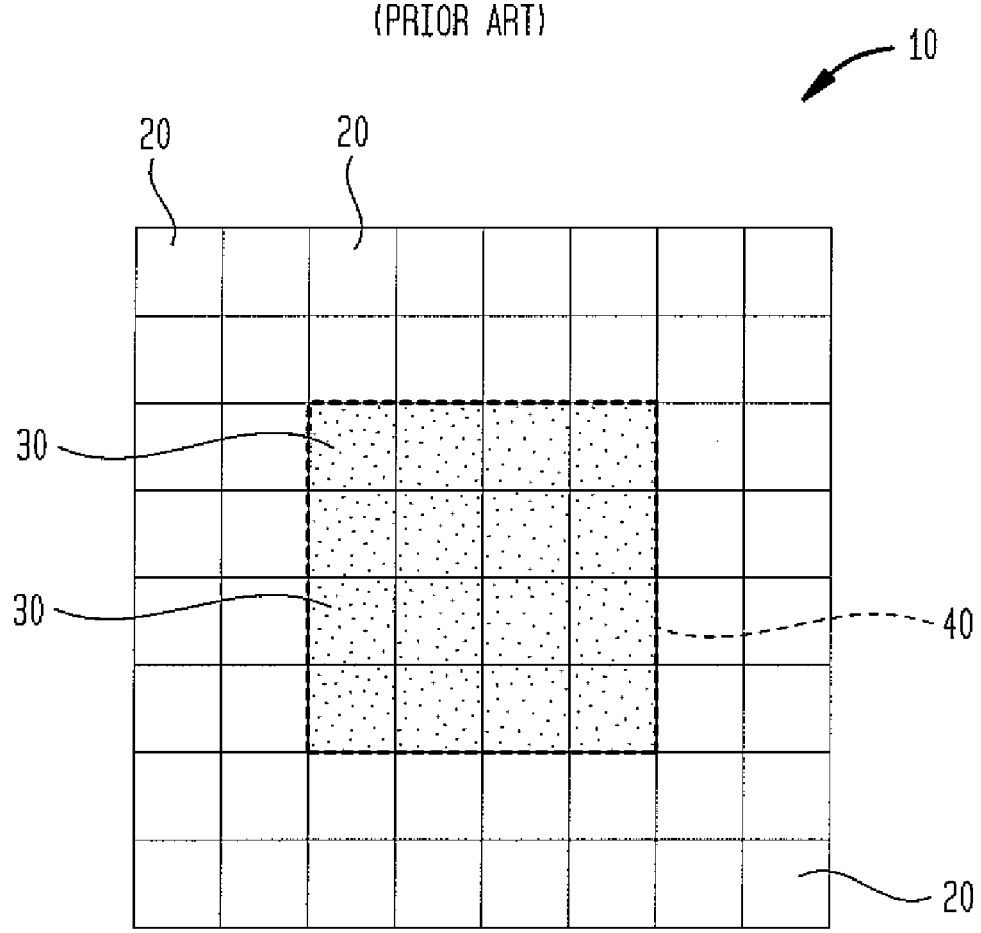
FIG. 1 is a diagram showing pixel binning as is known in the art.

Presently, pixel binning is achieved by combining the outputs of an n by n matrix of pixels in a photodetector, where n is any desired integer. For example, in the photodetector 10 shown in FIG. 1, which comprises a number of pixels 20, a 4-by-4 bin can be produced by combining the outputs of 16 pixels 30 to produce an effective super-pixel 40. The super-pixel 40 has increased sensitivity, but decreased resolution. The signals generated by the pixels 30 can be summed or averaged. The binning geometries presently available in the art are limited by photodetector circuitry, and cannot be easily manipulated. Further, present photodetectors cannot bin across partial pixel areas.

Figure 2A:
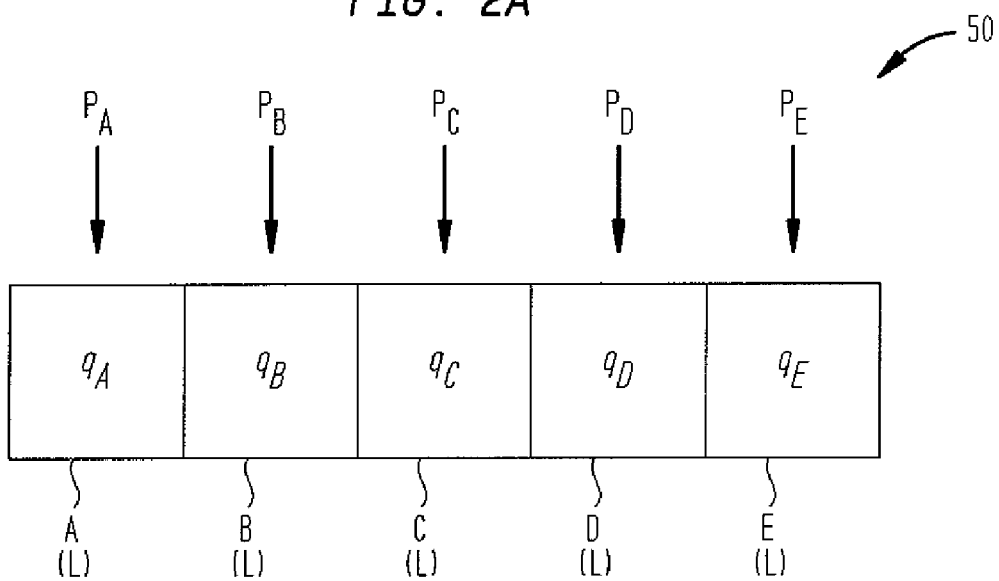
FIG. 2a is a diagram showing a photodetector array according to the present invention, wherein each pixel is set to a low input impedance level.
Figure 2B:
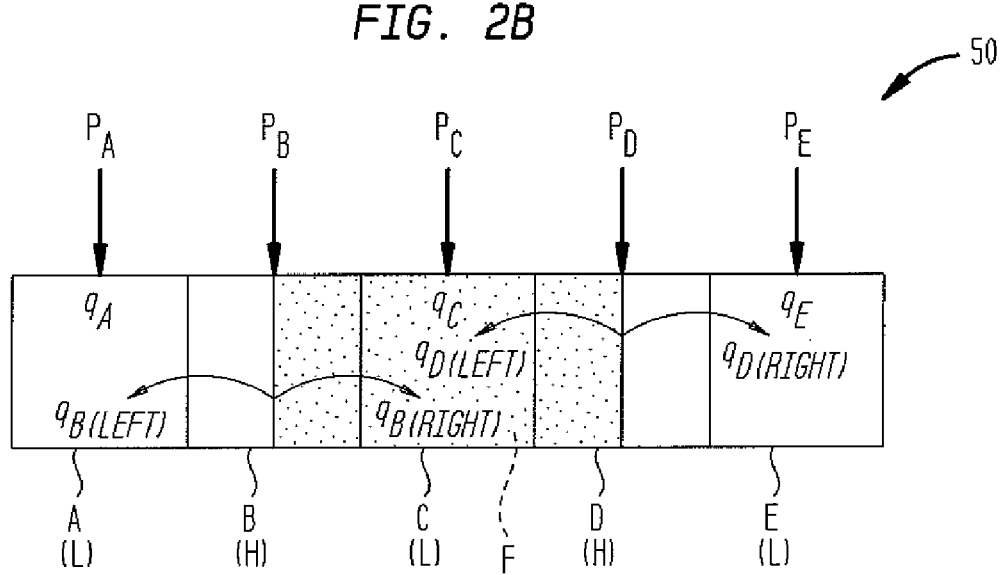
FIG. 2b is a diagram showing a photodetector array according to the present invention, wherein alternating pixels are set to high and low input impedance levels.

FIGS. 2*a* and 2*b* show the binning principle of the present invention, which can be implemented in any suitable photodetector, and which allows for flexible bin geometries to be produced. FIG. 2*a* is a diagram showing charges generated in a photodetector array 50 according to the present invention, wherein each of the pixels are set to a low input impedance level. Photons $P_A$-$P_E$ detected by each of the pixels A through E generate electrical charges $q_A$ through $q_E$, respectively. In this arrangement, each of the pixels A through E can detect charges generated by photons striking each respective pixel. The low input impedance level could be any desired value, such as from approximately 0 to 500 k ohms. The photodetector 50 could be any suitable detector, such as a charged coupled device (CCD), a focal plane array (FPA), an active pixel sensor (APS), or other detector. Impedance levels of each pixel are preferably individually addressable, but could also be addressed in any other way, such as by column, row, or in a grid pattern.

FIG. 2*b* is a diagram showing charges generated in the photodetector 50 according to the present invention, wherein both high and low input impedance levels are applied to the pixels A through E. Pixels A, C, and E are set to a low input impedance level, which could range from approximately 0 to 500 k ohms, while pixels B and D are set to high impedance level. The high input impedance level is approximately 10 times greater than the low input impedance level, and typically ranges from approximately greater than 500 k ohms to 1 G ohm, but could be even higher.

Charges $q_A$, $q_C$, and $q_E$ generated by photons $P_A$, $P_C$, and $P_E$ intercepted by pixels A, C, and E are collected at each of these pixels, respectively. However, charges $q_B$ and $q_D$ generated by photons PB and PD intercepted by pixels B and D, which are set to a high impedance, are not collected at the pixels B and D. Rather, the charges $q_B$ and $q_D$ migrate to pixels A, C, and E, such that a portion of the charge $q_B$, designated as $q_B$(LEFT) and corresponding to the left-hand side of pixel B, is collected at pixel A and the remaining portion of the charge $q_B$, designated $q_B$(RIGHT) and corresponding to the right-hand side of pixel B, is collected at pixel C. Further, a portion of the charge $q_D$, designated as $q_D$(LEFT) and corresponding to the left-hand side of pixel D, is collected at pixel C and the remaining portion of the charge $q_D$, designated as $q_D$(RIGHT), is collected at pixel E. This results in a bin area or "super-pixel" F, which extends partially across pixel B, fully across pixel C, and partially across pixel D. The charges collected at pixel C correspond to photons intercepted by the bin area F. Thus, as can be appreciated, the present invention allows photons to be collected from whole and partial pixel areas. The charges collected by the photodetector 50 can be summarized as follows:

TABLE 1

| Pixel | Impedance | Charge Collected |
|---|---|---|
| A | Low | $q_A + q_{B(LEFT)}$ |
| B | High | 0 |
| C | Low | $q_{B(RIGHT)} + q_C + q_{D(LEFT)}$ |
| D | High | 0 |
| E | Low | $q_E + q_{D(RIGHT)}$ |

As can be seen in Table 1, each of the low input impedance pixels A, C, and E collect charges $q_A$, $q_C$, and $q_E$ corresponding to full pixel areas A, C, and E, in addition to partial pixel areas. The output of pixel A corresponds to light intercepted by a bin that includes pixel A and the left portion of pixel B. The output of pixel C corresponds to light intercepted by a bin that includes the right portion of pixel B, the entire pixel C, and the left portion of pixel D (shown in FIG. 2*b* as bin F). The output of pixel E corresponds to light intercepted by a bin that includes the right portion of pixel D and all of pixel E.

The response of the low input impedance pixels A, C, and E to charges generated in adjacent high input impedance pixels D and B is a trapezoidal function of the distance between the centers of the low input impedance pixels. The response could also be closely approximated as a rectangular function. It should be noted that the input impedance levels of each of the pixels A through E could be varied to achieve a desired binning geometry, e.g., to produce a bin that extends over any desired number of pixels, or portions thereof. Further, while the binning shown in FIG. 2*b* is illustrated in a one-dimensional photodetector array, flexible binning can be achieved in two-dimensional arrays, as will be discussed herein in greater detail.

Advantageously, binning occurs within the photodetector array 50, and not in readout circuitry associated with the array 50. This overcomes limitations of previous binning techniques that are performed in such circuitry, by eliminating noise introduced by such circuits and increasing the signal-to-noise (S/N) ratio of the photodetector. Input impedance levels of each pixel of the photodetector array 50 can be controlled using any suitable technique, and need not require any additional hardware. For example, the input impedance levels can be programmed into and stored individually in each pixel. Further, the levels can be controlled for each pixel based upon logic signals distributed along rows and columns of the array. Additionally, the impedances can be controlled by analog signals distributed along rows and columns of the array, in fixed or random patterns.

The input impedance function can be implemented by varying the bias on input transistors of each pixel of the photodetector array 50, or by setting the voltage of a capacitive transimpedance amplifier (CTIA) input so that individual pixels cannot sink current due to limited output signal swing. Alternatively, a separate input transistor can be used at the input of a readout circuit operable with each pixel of the array. Such circuit can be designed to automatically read only those pixels in the array that contain a binned signal present at a low input impedance pixel.

FIG. 3 is a diagram showing pixel binning achieved by the present invention in a two-dimensional photodetector array, indicated generally at 100. As mentioned earlier, the binning technique shown in the one-dimensional array 50 of FIG. 2*b* can be extended to two dimensions, so that any desired, two-dimensional bin geometry can be achieved. The bin 140 shown in FIG. 3 is square in shape, and extends over a central pixel 130 and partially across peripheral pixels 120. The peripheral pixels 120 are set to a high input impedance, indicated by H, so that a portion of charge carriers generated by the pixels 120 migrate to central pixel 130. The central pixel 130 is set to a low input impedance, indicated by L. The migrated charge carriers, in addition to charge carriers generated by pixel 130, are collected at pixel 130, resulting in the bin 140. The bin 140 effectively operates as a super-pixel that can detect photons across the entire area bounded by bin 140.

Figure 4:
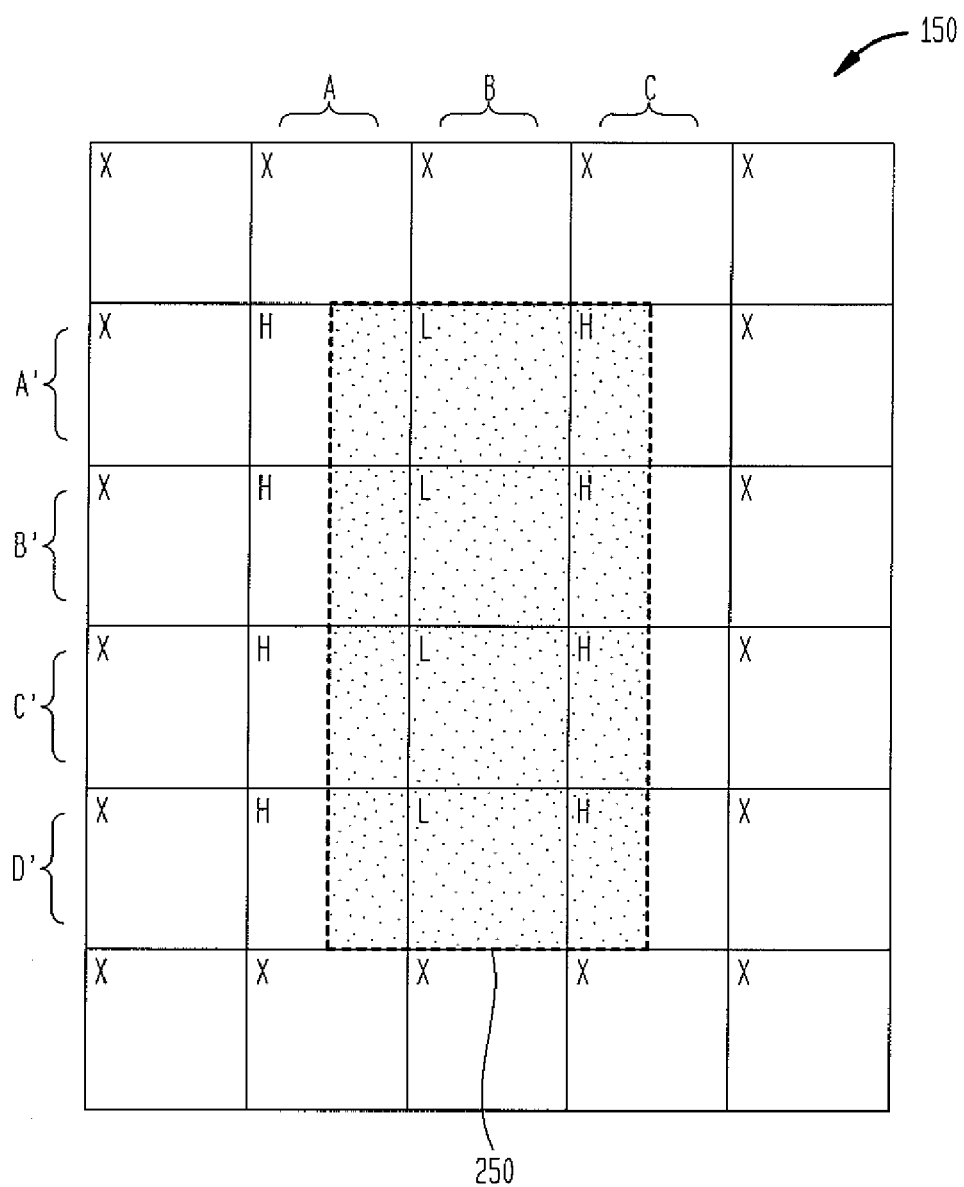
FIG. 4 is a diagram showing pixel binning achieved by the present invention in a two-dimensional photodetector array, wherein a rectangular bin is provided.

FIG. 4 is a diagram showing pixel binning achieved by the present invention in a two-dimensional photodetector array indicated generally at 150, wherein a rectangular bin 250 is provided. As mentioned earlier, the present invention allows bins of any desired geometry to be produced in a photodetector array. For purposes of illustration, the pixels of photodetector 150 can be individually addressed in a matrix format using rows and columns to address each pixel. Input impedance levels of each pixel can be individually addressed. For example, pixel AA' of photodetector 150 is set to high input impedance level H, as is pixel CD'. Pixels around the perimeter of the photodetector 150 are "dummy" pixels, indicated as X, and are inactive. It should be noted that such pixels could be set to high or low pixel values as desired.

To produce the rectangular bin 250, pixel columns A and C are preferably set to a high input impedance H, so that charge carriers generated by those pixels migrate away therefrom. Pixel column B is set to a low input impedance L, so that charge carriers migrated from the high input impedance pixels can be collected thereat, in addition to charge carriers generated at the low input impedance pixels. This produces a bin 250 having a rectangular shape, extending partially over pixel column A, across pixel column B, and partially across pixel column C. The partial pixel areas of the bin include the right-hand sides of pixels AA', AB', AC', and AD', designated as half-pixel areas $AA'_{RIGHT}$, $AB'_{RIGHT}$, $AC'_{RIGHT}$, and $AD'_{RIGHT}$, as well as the left-hand sides of pixels CA', CB', CC', and CD', designated as half-pixel areas $CA'_{LEFT}$, $CB'_{LEFT}$, $CC'_{LEFT}$, and $CD'_{LEFT}$. The bin 250 can be collected at pixel column B, which pixels have been set to a low input impedance. The charges collected by bin 250 can be expressed mathematically as follows:

$$Bin = AA'_{RIGHT} + AB'_{RIGHT} + AC'_{RIGHT} + AD'_{RIGHT} + BA' + BB' + BC' + BD' + CA'_{LEFT} + CB'_{LEFT} + CC'_{LEFT} + CD'_{LEFT}$$

Equation 1

As can be readily appreciated, by selectively manipulating pixel intensities, a bin of any desired pattern or geometry can be produced, and photons detected within the bounds of the bin. Indeed, even triangular or generally circular bins could be provided using the present invention. Thus, flexible binning can be provided across any desired number of pixels in an array, or any desired portions thereof. Flexible binning can be used to enhance resolution as described in U.S. patent application Ser. No. 11/125,305, entitled "Method and Apparatus for Providing Enhanced Resolution in Photodetectors" filed on even date herewith, the entire disclosure of which is expressly incorporated herein by reference.

Having thus described the invention in detail, it is to be understood that the foregoing description is not intended to limit the spirit and scope thereof. What is desired to be protected by Letters Patent is set forth in the appended claims.

What is claimed is:

1. A photodetector for providing flexible binning comprising:
   an array of pixels;
   means for individually controlling input impedance levels of each of the pixels; and
   a bin area within the array of pixels for detecting photons, wherein shape of the bin area is adjustable by the means for individually controlling the input impedance levels of the pixels and the bin area includes at least one partial pixel area.

2. The photodetector of claim 1, wherein the array of pixels comprises a charge coupled device (CCD) photodetector.

3. The photodetector of claim 1, wherein the array of pixels comprises a focal plane array (FPA).

4. The photodetector of claim 1, wherein the array of pixels comprises an active pixel sensor (APS).

5. The photodetector of claim 1, wherein the means for individually controlling input impedance levels comprises a plurality of transistors connected to the array of pixels.

6. The photodetector of claim 5, wherein each of transistors are settable to high or low input impedance levels.

7. The photodetector of claim 1, wherein the means for individually controlling input impedance levels comprises control signals propagated through rows and columns of the array of pixel for controlling pixel input impedance levels.

8. The photodetector of claim 1, wherein the array of pixels comprises at least one high input impedance pixel and at least one low input impedance pixel.

9. The photodetector of claim 8, wherein charges generated by photons received within the bin area are collectable at the low input impedance pixel.

10. The photodetector of claim 9, wherein charge carriers generated in the high input impedance pixel migrate to the low input impedance pixel.

11. The photodetector of claim 1, wherein the shape of the bin area is adjustable by switching input impedance levels of pixels of the array.

12. The photodetector of claim 11, wherein the bin area is rectangular in shape.

13. The photodetector of claim 11, wherein the bin area is square in shape.

14. The photodetector of claim 11, wherein the bin area is triangular in shape.

15. The photodetector of claim 11, wherein the bin area is circular in shape.

16. The photodetector of claim 1, wherein the bin area extends over a plurality of partial pixel areas.

17. A method for providing flexible photodetector binning comprising:
   providing a photodetector array;
   producing a bin area within the photodetector array by setting at least one pixel within the photodetector array to a low input impedance level and setting remaining pixels within the photodetector array to a high input impedance level;
   receiving photons with the photodetector array, the photons generating charges within the pixels of the array;
   allowing charges generated at high input impedance pixels to migrate to at least one low input impedance pixel; and
   collecting charges at the at least one low input impedance pixel, the charges corresponding to photons received by the bin area.

18. The method of claim 17, wherein the step of providing a photodetector comprises providing a charge coupled device (CCD) photodetector.

19. The method of claim 17, wherein the step of providing a photodetector comprises providing a focal plane array (FPA).

20. The method of claim 17, wherein the step of providing a photodetector comprises providing an active pixel sensor (APS).

21. The method of claim 17, wherein the step of producing the bin area comprises selectively setting transistors connected to the pixels to high or low input impedance settings.

22. The method of claim 17, wherein the step of producing the bin area comprises sending input impedance control signals through rows and columns of the array to selectively set the pixels to high or low input impedance settings.

23. The method of claim 17, further comprising:

altering input impedance levels of one or more pixels in the array to produce a new bin area;

receiving photons with the new bin area; and collecting charges from at least one low input impedance pixel within the new bin area, the charges corresponding to photons received by the new bin area.

* * * * *